United States Patent [19]

Horii

[11] 4,392,154
[45] Jul. 5, 1983

[54] SOLID-STATE COLOR IMAGE SENSOR

[75] Inventor: Kenju Horii, Ootsu, Japan

[73] Assignee: Matsushita Electronics Corp., Osaka, Japan

[21] Appl. No.: 272,169

[22] Filed: Jun. 10, 1981

[30] Foreign Application Priority Data

Jun. 17, 1980 [JP] Japan .................................. 55-82647

[51] Int. Cl.³ .......................... H04N 9/07; H04N 3/15
[52] U.S. Cl. ...................................... 358/44; 358/213
[58] Field of Search ........................... 358/44, 43, 213; 357/24 LR; 250/578

[56] References Cited

FOREIGN PATENT DOCUMENTS 55-11682  1/1980  Japan ...................................... 358/44
55-124368 9/1980  Japan ...................................... 358/213

Primary Examiner—John C. Martin
Attorney, Agent, or Firm—Burgess, Ryan and Wayne

[57] ABSTRACT

A solid-state color image sensor in which a photosensor region comprises a plurality of parallel transfer electrodes and a plurality of channel stops extended at right angles to the transfer electrodes; the photosensor region is divided into a plurality of elements each comprising a predetermined number of transfer electrodes; one of the transfer electrodes of each element which are adjacent to other elements is optically shielded; and voltages are applied to the transfer electrodes of each element in such a way that the potentials below the optically shielded transfer electrode, the transfer electrode or electrodes which do not collect signal charges, the channel stop and the transfer electrode or electrodes which collect the signal charges become progressively deeper in the order named. Mixtures of the signal charges from the different color picture elements can be avoided, so that an image with a higher degree of color purity can be obtained.

6 Claims, 12 Drawing Figures

SOLID-STATE COLOR IMAGE SENSOR

BACKGROUND OF THE INVENTION

The present invention relates to a solid-state image sensor and more particularly a frame-transfer type CCD image sensor.

In conventional solid-state color image sensors, a color filter in the form of a mosaic comprising green, blue and red color filter elements is registered with a solid-state image sensor. Therefore, the picture elements below the green, blue and red color filter elements become sensitive to picture information in the green, blue and red contents, respectively, of the image. The charges derived from the green, blue and red picture elements are converted into the green, blue and red video signals, respectively. That is, the charges created below the green, blue or red color filter elements must produce the pure green, blue or red video signal. However, in the prior art solid-state color image sensor, the charges created in one color picture element are mixed with the charges created in the other color picture elements, so that poor color separation results; that is, incorrect color mixtures are produced.

SUMMARY OF THE INVENTION

The present invention was made to overcome the above and other problems encountered in the prior art solid-state image sensors.

One of the objects of the present invention is, therefore, to provide a solid-state color image sensor capable of high-quality image reproduction in color.

Another object of the present invention is to avoid the mixtures of the charges from different color picture elements which present a serious problem when a solid-state color image sensor is designed with only one image sensor.

Briefly, stated, to the above and other ends, the present invention provides a solid-state color image sensor in which a photosensor region comprises a plurality of parallel transfer electrodes and a plurality of channel stops extended at right angles to the transfer electrodes; the photosensor region is divided into a plurality of color picture elements each comprising a predetermined number of transfer electrodes; one of the transfer electrodes of each color picture element which are adjacent to other color picture elements is optically shielded; and voltages are applied to the transfer electrodes of each color picture element in such a way that the potentials below the optically shielded transfer electrode, the transfer electrode or electrodes which do not collect the signal charge, the channel stop and the transfer electrode or electrodes which collect the signal charge become progressively deeper in the order named during the integration time.

The above and other effects and features of the present invention will become more apparent from the following description of preferred embodiments thereof taken in conjunction with the accompanying drawings.

DESCRIPTION OF THE PRIOR ART

Figure 1:
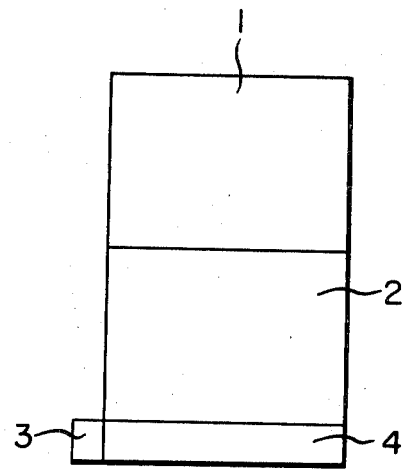
FIG. 1 is a schematic view showing the construction of a frame-transfer type solid-state image sensor.

A charge-coupled image sensor fundamentally comprises a photosensor region, a storage region and a read-out region. In FIG. 1 is shown a frame-transfer type charge-coupled solid-state image sensor comprising a photosensor region 1, a storage region 2 for temporarily store information received from the photosensor region 1 and a read-out region 4 including an output circuit 3 for sequentially reading out the signals from the storage region 2. When light falls on the photosensor region 1, the charges are generated and accumulated or integrated for a predetermined time period and then transferred within a very short time period to the storage region 2 which is shielded against light. The information stored in the region 2 is read out through the read-out region 4. While the charges transferred into the storage region 2 are read out, the charges are accumulated or integrated in proportion to the amount of incident light in the region 1. After the information in the storage region 2 has been completely read out, the same step as described above is repeated so that the charges in the region 1 are transferred into the storage region 2.

The above-description three regions 1, 2 and 4 are defined by the repetitive structure or arrangement of transfer electrodes. That is, the photosensor region 1 comprises a plurality of rows each comprising two or more horizontally extended transfer electrodes. The rows are divided by vertical gate-controlled channel-stop electrodes, whereby channel stops are defined. Formed below the gate-controlled channel-stop electrodes are regions whose conductivity is opposite to that of a substrate of semiconductor, whereby p-n junctions are formed. Therefore, the excess charges; that is, the charge in excess of the maximum charge which can be stored in each potential well associated with each picture element of the photosensor region 1 is absorbed by the p-n junction. That is, the overflow drain is provided.

Figure 2:
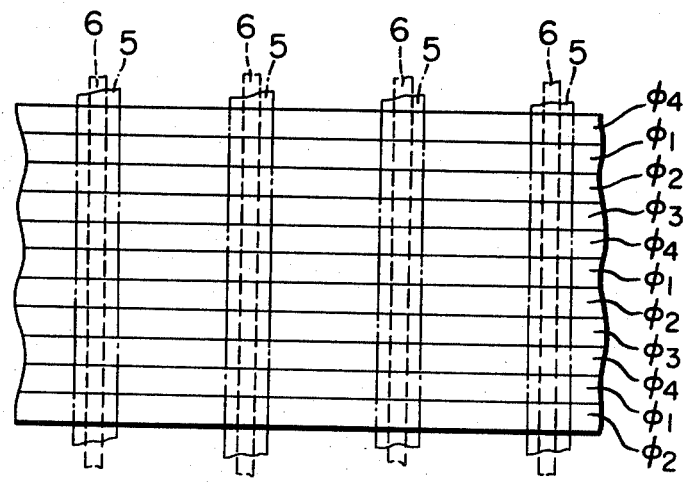
FIG. 2 is a schematic view showing the surface of a light-reception region thereof.

In FIG. 2 is shown schematically the construction of the photosensor region 1 defined by four transfer electrodes. The repetitive structure or arrangement of transfer electrodes $\phi_1$ to $\phi_4$ is formed with conductive films of, for instance, polysilicon which are transparent to light. When a suitable voltage is impressed on gate-controlled channel-stop electrodes 5, potential barrier voltages which define or separate the transfer channels are generated. The charges which overflow the potential barrier voltage flow into overflow drains 6 which are so biased so to receive the overflow charge.

Figure 3:
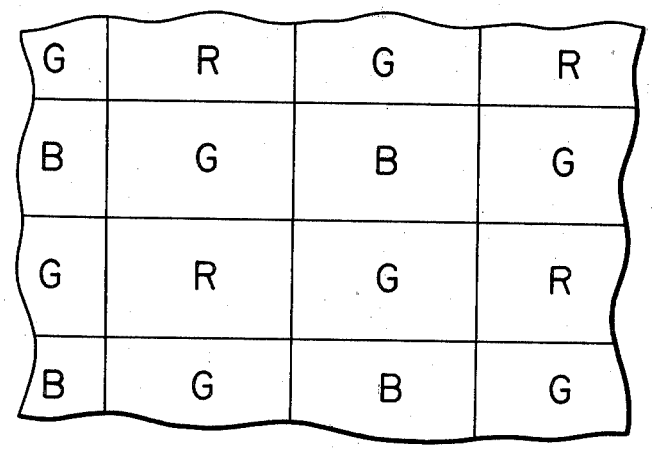
FIG. 3 is a schematic view showing a three-color filter which is registered with a single-plate image sensor so as to provide a solid-state color image sensor.
Figure 4:
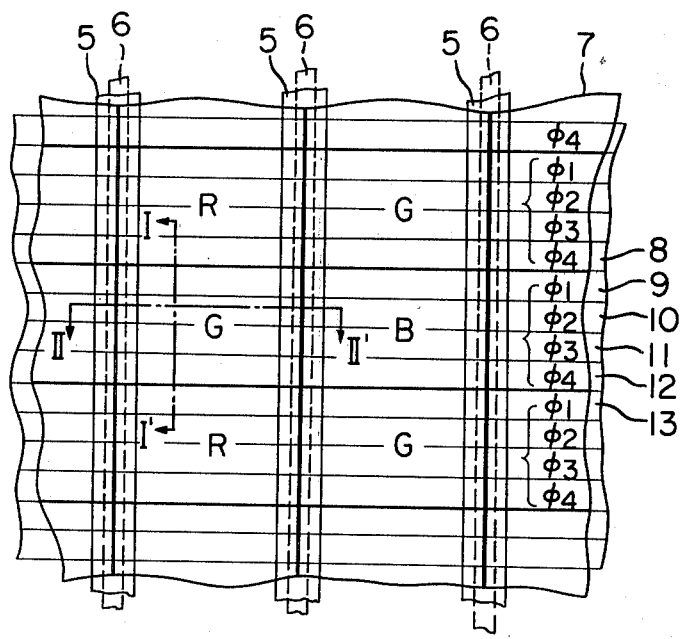
FIG. 4 is a top view of the three-color filter registered with a solid-state image sensor.

If the solid-state image sensor with the construction described above is used to provide a color image sensor, the following serious and fatal problems arise. That is, the solid-state image sensor is covered with a two-dimensional color mosaic filter having green (G), blue (B) and red (R) filter elements as shown in FIG. 3. Therefore, as shown in FIG. 4, the picture elements below the green, blue and red filter elements G, B and R become sensitive to the green, blue and red light, respectively. It follows, therefore, that the charges generated by the light passing through the green filter element G must be derived as the green light signal; the charges generated by the light passing through the blue filter element B, as the blue light signal; and the charges generated by the light passing through the red filter element R, as the red light signal. To put in another way, the charges generated by the light passing through one filter element G, B or R must solely be used to generate the signal representative of the photoimage passed through that color filter element. If the charges generated by the light passed through one filter element are mixed with the charges generated by the light passed through another color filter element, incomplete separation of color or incomplete color registration results in the reproduction of the image received.

Figure 5A:
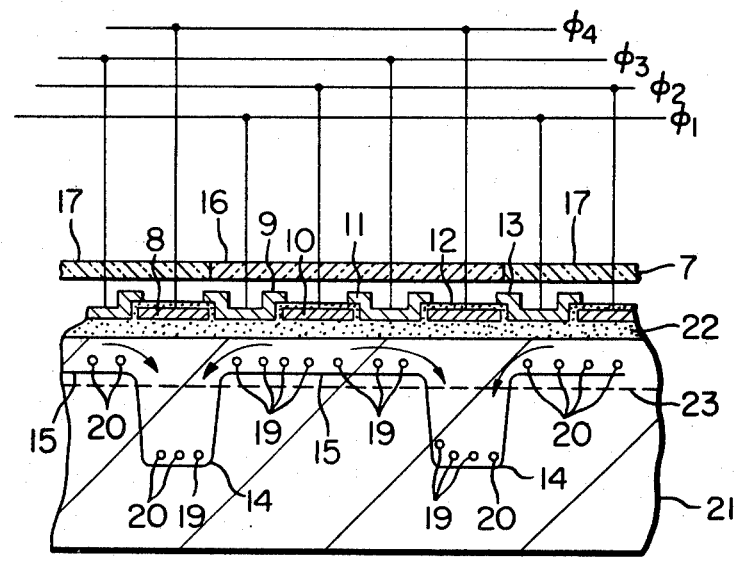
FIG. 5A is a sectional view taken along the line I'-I' of FIG. 4.
Figure 5B:
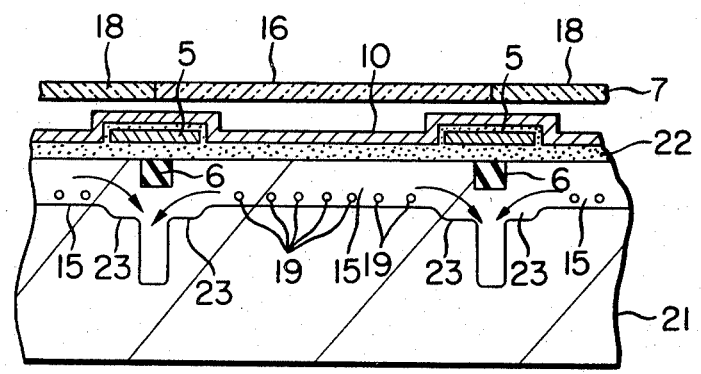
FIG. 5B is a sectional view taken along the line II'-II' of FIG. 4.

The movement of charges will be described with reference to FIG. 5A which is a cross sectional view taken along the line I–I' of FIG. 4 and FIG. 5B which is a cross sectional view taken along the line II–II' of FIG. 4. In the case of the image sensor made of a p-type silicon substrate, a high positive voltage is impressed only to the transfer electrode $\phi_4$ so that a deep potential well 14 is formed below the electrode $\phi_4$ while shallow potential wells 15 are formed below the remaining transfer electrodes $\phi_1$, $\phi_2$ and $\phi_3$. The potential wells 15 below the transfer electrodes $\phi_1$, $\phi_2$ and $\phi_3$ is maintained higher than the potential wells 23 below the gate-controlled channel-stop electrodes, so that the excess charges stored in the potential well below the transfer electrode $\phi_4$ may be absorbed by the overflow drain before they move below the transfer electrodes $\phi_1$, $\phi_2$ and $\phi_3$ and fall into the potential well below the transfer electrode $\phi_4$ of the next element (See FIG. 5B). The light incident on the photosensor region passes through the transparent transfer electrodes $\phi_1$ to $\phi_4$ so that charges are generated in a silicon substrate 21. Almost all the charges generated by the light incident on the transfer electrode 12 are stored in the potential well below the electrode 12 while the charges 19 generated by the light incident on the transfer electrodes 9, 10 and 11 move to and fall into the adjacent potential well below the transfer electrode 8 or 12 to which is applied the charge integration voltage or they are absorbed into the overflow drains. The charges except those absorbed into the overflow drains will affect the image reproduction in color. Especially, the charges 19 which have fallen into the potential well below the transfer electrode 8 and which correspond to the green video signal because the light has fallen on the transfer electrode 8 through the green filter element 16 move into the element below the red filter element 17 and behave as if they were the red video charges. That is, the charges 19 mix with the charges 20 generated by the light passed through the red filter element 17 in the potential well below the transfer electrode 8, so that incorrect color mixtures are produced.

As described above, in the case of the frame-transfer type image sensor, mixing of the color video signals in the vertical direction; that is, the direction in which the transfer electrodes are arranged repetitively cannot be avoided. This is the fatal problem in the design of color image sensor.

DESCRIPTION OF THE PREFERRED EMBODIMENTS

Figure 6:
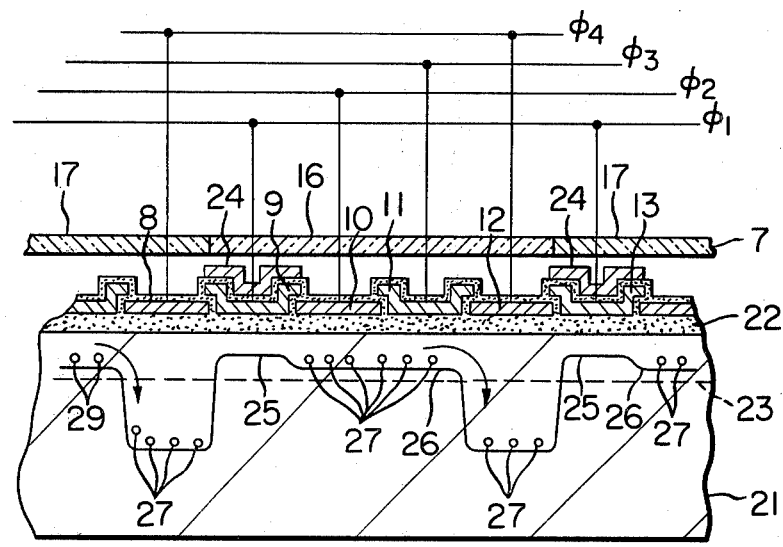
FIGS. 6 to 9 are sectional views of first through fourth embodiments, respectively, of the present invention.

In FIG. 6 is shown a first embodiment of the present invention in which a transfer electrode $\phi_1$ is coated with an opaque film 24. The integration voltage is applied to a transfer electrode $\phi_3$ and a voltage is impressed to an electrode $\phi_1$, so that a shallow potential well 25 is formed. A voltage is applied to electrodes $\phi_2$ and $\phi_3$ in such a way that the potential well 26 below them may be deeper than the potential well formed below the electrode $\phi_1$ but is shallower than the potential well 23 formed below the gate-controlled channel-stop electrode.

The light which passes through the green filter element 16 generates the charges 27 below the transfer electrodes 10, 11 and 12. The charges 27 spread by diffusion and fall in the potential well below the transfer electrode 12 under the green filter element 16 or are absorbed into the overflow drain through the potential well 23 below the gate-controlled channel-stop electrode. The shallow potential well 25 below the transfer electrode 9 serves as a barrier so that the charges generated below the green filter element 16 are prevented from moving and falling into the potential well formed below the transfer electrode 8 under the other color filter element 17. Therefore, the mixtures of the color video charges will not occur. That is, only the charges created below the same green color filter element 16 are stored in the potential well below the transfer electrode 12, so that no color mixture is produced. Thus, according to the present invention, the migration of the charges created in one color picture element into the other color elements can be positively prevented, so that a color image sensor which ensures high-quality color image reproduction may be provided.

If the color picture elements and the color filter elements are not correctly registered, the light which has passed through two or three color filter elements fall on one color picture element so that color mixtures are also produced. However, according to the present invention, the transfer electrode $\phi_1$ is covered with the opaque film 24 so that the tolerance limit to the registration between the color picture elements and the color filter elements may be relaxed. Thus, the color mixtures due to incorrect registration between the color picture elements and the color filter elements can be avoided.

The prior art color image sensor has a color mixture ratio of 20% which is fatal to the image reproduction in color. According to the present invention, a color image sensor was fabricated with a p-type silicon substrate. The horizontal repetitive pitch was 24 μm and the vertical repetitive pitch was 28 μm. The electrode $\phi_1$ was 6 μm in length and was coated with an aluminum film. When −5 V was applied to the transfer electrode $\phi_1$, +8 V was applied to the transfer electrodes $\phi_2$, $\phi_3$ and $\phi_4$ when charges were stored but 0 V was applied to them when no charge was stored and +2 V was applied to the gate-controlled channel-stop electrode, the color mixture ratio was less than 1%. Thus, it is apparent that the color mixture ratio is remarkably improved according to the present invention, so that the high-quality image reproduction in color can be ensured.

Figure 7:
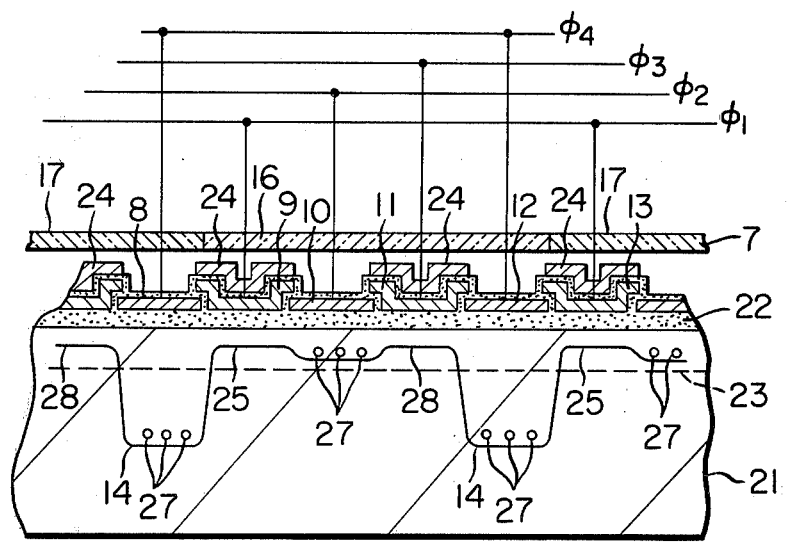

In FIG. 7 is shown a second embodiment of the present invention. In addition to the electrode $\phi_1$, the transfer electrode $\phi_3$ is coated with an opaque film 24. A suitable voltage is applied to the transfer electrode $\phi_3$ so that a potential barrier 28 may be created and consequently the charges 27 created below the transfer electrode $\phi_2$ will not permitted to move and fall into the potential well below the transfer electrode $\phi_4$ under the same color filter element 16. As a result, the charges created below the transfer electrode $\phi_2$ move below the gate-controlled channel-stop electrode and are absorbed into the overflow drain. Consequently, of the charges created by the incident light, only the charges created below the transfer electrode $\phi_4$ to which is applied the integration voltage are stored. Thus, according to the second embodiment of the present invention, not only the color mixture ratio but also the resolution can be improved.

Figure 8:
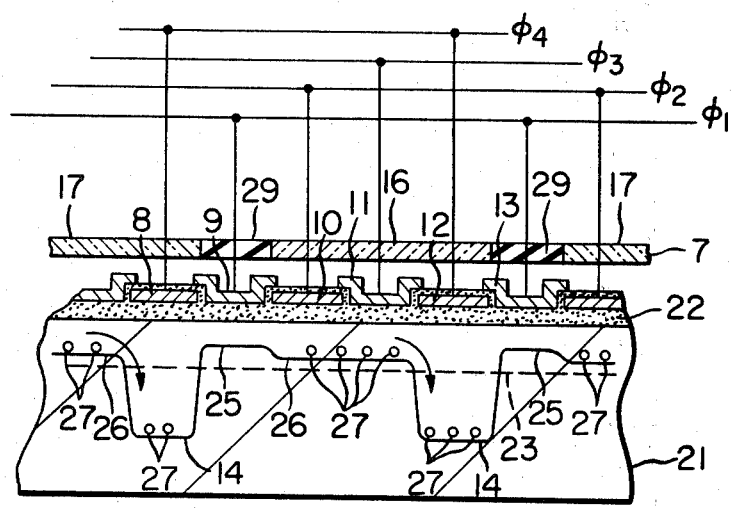

In FIG. 8 is shown a third embodiment of the present invention. In order to optically shield the transfer electrode $\phi_1$, the color filter element 16 includes a black filter element 29 which correctly registers with the transfer electrode $\phi_4$. The transfer electrode $\phi_1$ is impressed with such a voltage that a potential barrier 25 may be formed and consequently the immigration of charges created below one color filter element 16 to the adjacent color picture elements can be prevented.

Figure 9:
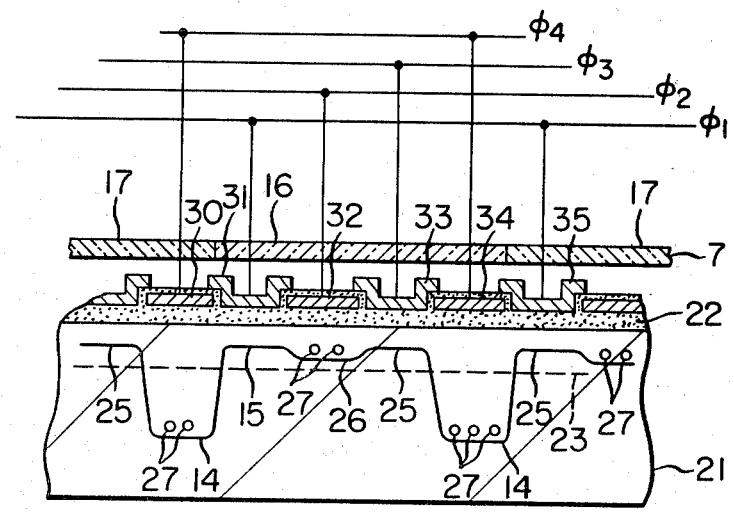

In FIG. 9 shown a fourth embodiment of the present invention. The transfer electrodes $\phi_1$ and $\phi_3$ are coated with opaque films such as aluminum films and, during the integration time, are impressed with such a voltage that a potential barrier 25 against charges may be formed. As a result, the charges 27 generated below the transfer electrode 32 cannot pass the potential barrier 25 created below the adjacent transfer electrodes 31 and 33 and consequently move below the gate-controlled channel-stop electrode to be absorbed into the overflow drain. In other words, they will not fall into the potential well created below the transfer electrodes 30 and 34. As a consequence, no color mixture is produced. The effects and features of the fourth embodiment are substantially similar to those of the above-described first to third embodiments and the image with a higher degree of color purity can be obtained.

Figure 10A:
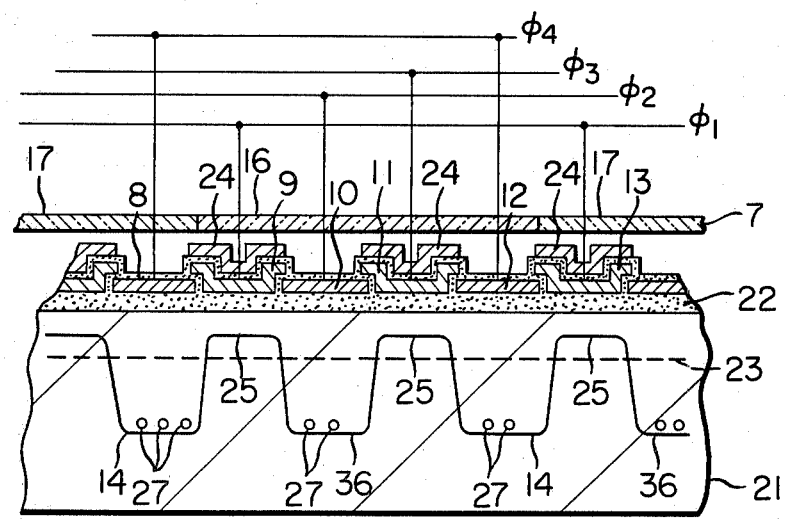
FIGS. 10A and 10B are views used for the explanation of the movement of charges in the solid-state color image sensor in accordance with the present invention.
Figure 10B:
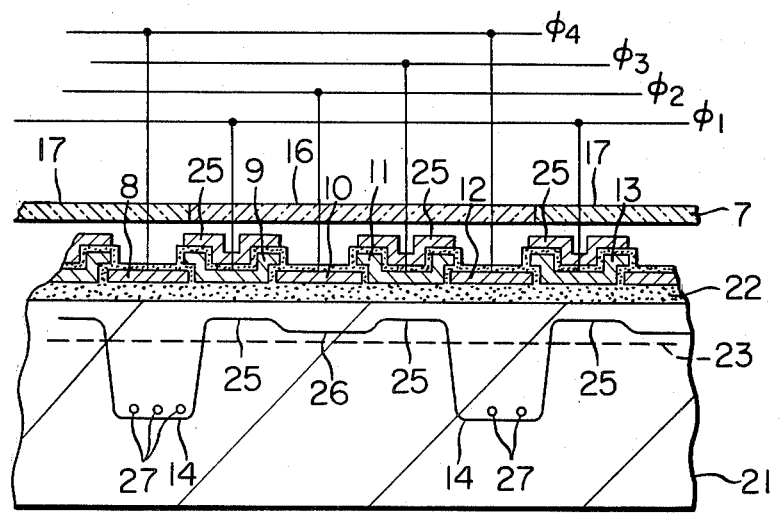

According to the present invention, a predetermined voltage is applied during the integration time. Referring back to FIG. 6, a voltage higher than a voltage applied to the gate-controlled channel-stop electrode may be applied to the transfer electrode $\phi_2$ during the integration time so as to collect the charges. Thereafter, the transfer electrode $\phi_2$ is impressed with a voltage which is between the voltage applied to the transfer electrode $\phi_1$ and the voltage applied to the gate-controlled channel-stop electrode, so that the charges below the transfer electrode $\phi_2$ may be moved into the overflow drain in one time. FIG. 10A shows the potential wells created below the transfer electrodes $\phi_2$ and $\phi_4$ and FIG. 10B shows the device after the unwanted charges below the electrode $\phi_2$ have been absorbed into the overflow drain. When voltages are applied so that the potential wells are created as shown in FIGS. 10A and 10B, color-image-reproduction characteristics similar to those attained by the first embodiment shown in FIG. 6 can be obtained. The mode of operation as shown in FIGS. 10A and 10B may be equally applied to the other embodiments of the present invention.

So far each color picture element has been described as comprising four transfer electrodes, but it is to be understood that the present invention may be equally applied to the color image sensor in which each color picture element comprises two or three transfer electrodes.

It is also to be understood that the present invention may be equally applied not only to the color image sensor in which one overflow drain is formed under each gate-controlled channel-stop electrode but also to the color image sensor in which one overflow drain is formed below an alternate gate-controlled channel-stop electrode so as to attain a high integration density. In the embodiments of the present invention, the channel stops have been described as being provided by the gate-controlled channel-stop electrodes, but it is apparent that the present invention may be equally applied to the color image sensor of the type in which the channel stops are conduction layers having the same electric conductivity as a semiconductor substrate.

What is claimed is:

1. A solid-state image sensor, comprising;
    a plurality of transfer electrodes disposed in parallel with each other on a semiconductor substrate of one conductivity type;
    a plurality of channel stops of the other conductivity type formed on said semiconductor substrate so as to cross said transfer electrodes, whereby a photosensor region is formed;
    each element in said photosensor region comprising a predetermined number of said transfer electrodes;
    one of the transfer electrodes of each element which is adjacent to other elements being optically shielded; and
    means for applying voltages to the transfer electrodes, respectively, of each element in such a way that during the integration time (i) the potential below one transfer electrode which does not collect signal charges becomes deeper than the potential below said optically shielded transfer electrode, (ii) the potential below the adjacent channel stop becomes deeper than the potential below said one transfer electrode which does not collect said signal charges, and (iii) the potential below said one transfer electrode which does collect said signal charges becomes deeper than the potential below said adjacent channel stop.

2. A solid-state image sensor as set forth in claim 1, wherein
    said optically shielded transfer electrode is one of the transfer electrodes adjacent to other elements and is directly coated with an opaque film.

3. A solid-state image sensor as set forth in claim 1, further comprising:
    a mosaic color filter comprising a multiplicity of color filter elements disposed in front of said semiconductor, and
    each color filter element of said mosaic color filter having an opaque region which is in alignment with and optically shields one of said transfer electrodes adjacent to other elements.

4. A solid-state image sensor comprising:
    a plurality of transfer electrodes disposed in parallel with each other on a semiconductor substrate of one conductivity type;
    a plurality of channel stops of the other conductivity type formed on said semiconductor substrate so as to cross said transfer electrodes, whereby a photosensor region is formed;
    each element in said photosensor region comprising a predetermined number of said transfer electrodes;

one of the transfer electrodes of each element which is adjacent to other elements being optically shielded; and means for applying voltages to the transfer electrodes, respectively, of each element in such a way that during the integration time the potential below at least one transfer electrode which does not collect said signal charges becomes deeper than the potential below the adjacent channel stop and, after a predetermined time interval, the potential below said at least one transfer electrode being deeper than the potential below said optically shielded transfer electrode but shallower than the potential below said adjacent channel stop.

5. A solid-state image sensor as set forth in claim 4, wherein said optically shielded transfer electrode is one of the transfer electrodes adjacent to other elements and is directly coated with an opaque film.

6. A solid-state image sensor as set forth in claim 4, further comprising:

a mosaic color filter comprising a multiplicity of color filter elements disposed in front of said semiconductor substrate, each color filter element of said mosaic color filter having an opaque region which is in alignment with and optically shields one of said transfer electrodes adjacent to other elements.

* * * * *